United States Patent
Kayakubo et al.

(10) Patent No.: US 11,028,343 B2
(45) Date of Patent: Jun. 8, 2021

(54) CLEANING AGENT COMPOSITION FOR SUBSTRATE FOR SEMICONDUCTOR DEVICE

(71) Applicant: KAO CORPORATION, Tokyo (JP)

(72) Inventors: Daisuke Kayakubo, Wakayama (JP); Jun Naganuma, Wakayama (JP)

(73) Assignee: KAO CORPORATION, Tokyo (JP)

(*) Notice: Subject to any disclaimer, the term of this patent is extended or adjusted under 35 U.S.C. 154(b) by 199 days.

(21) Appl. No.: 16/474,918

(22) PCT Filed: Dec. 22, 2017

(86) PCT No.: PCT/JP2017/046192
§ 371 (c)(1),
(2) Date: Jun. 28, 2019

(87) PCT Pub. No.: WO2018/123889
PCT Pub. Date: Jul. 5, 2018

(65) Prior Publication Data
US 2021/0130739 A1  May 6, 2021

(30) Foreign Application Priority Data
Dec. 28, 2016 (JP) .............................. JP2016-256228

(51) Int. Cl.
| *C11D 7/34* | (2006.01) |
| *C11D 3/04* | (2006.01) |
| *H01L 21/02* | (2006.01) |
| *C11D 3/20* | (2006.01) |
| *C11D 11/00* | (2006.01) |
| *C11D 3/34* | (2006.01) |
| *H01L 21/304* | (2006.01) |

(52) U.S. Cl.
CPC ............. *C11D 3/042* (2013.01); *C11D 3/2096* (2013.01); *C11D 3/349* (2013.01); *C11D 11/0047* (2013.01); *H01L 21/02041* (2013.01); *H01L 21/304* (2013.01)

(58) Field of Classification Search
CPC ................................................. C11D 11/0047

USPC ........................................................ 510/175
See application file for complete search history.

(56) References Cited

U.S. PATENT DOCUMENTS

2019/0136161 A1* 5/2019 Kamimura ........... C11D 3/0073

FOREIGN PATENT DOCUMENTS

| JP | 11-251280 A | 9/1999 |
| JP | 2005-317808 A | 11/2005 |
| JP | 2010-163608 A | 7/2010 |
| JP | 2010-535422 A | 11/2010 |
| JP | 2014-170927 A | 9/2014 |
| JP | 2015-165561 A | 9/2015 |
| JP | 2015-165562 A | 9/2015 |
| WO | WO 2009/032460 A1 | 3/2009 |

OTHER PUBLICATIONS

International Search Report (PCT/ISA/210) issued in PCT/JP2017/046192, dated Feb. 27, 2018.
Written Opinion (PCT/ISA/237) issued in PCT/JP2017/046192, dated Feb. 27, 2018.

* cited by examiner

*Primary Examiner* — Gregory E Webb
(74) *Attorney, Agent, or Firm* — Birch, Stewart, Kolasch & Birch, LLP

(57) ABSTRACT

In one aspect, provided is a cleaning agent composition for a substrate for a semiconductor device, the cleaning agent composition having excellent cleaning properties against ceria and being capable of reducing a temporal change in the solubility of ceria.

In one aspect, the present disclosure relates to a cleaning agent composition for a substrate for a semiconductor device, the cleaning agent composition containing a component A, a component B, a component C, and a component D, the component A being sulfuric acid;
the component B being ascorbic acid;
the component C being at least one of thiourea and dithiothreitol and
the component D being water.

8 Claims, No Drawings

US 11,028,343 B2

CLEANING AGENT COMPOSITION FOR SUBSTRATE FOR SEMICONDUCTOR DEVICE

TECHNICAL FIELD

The present disclosure relates to a cleaning agent composition for a substrate for a semiconductor device, a method for cleaning a substrate for a semiconductor device using the cleaning agent composition, and a method for manufacturing a substrate for a semiconductor device using the cleaning agent composition.

BACKGROUND ART

In recent years, semiconductor devices such as semiconductor integrated circuits have been made smaller due to improvements in processing capabilities. Semiconductor devices are being made smaller, and thus highly accurate flatness of each layer of a substrate is required. Also, from the viewpoint of production efficiency and the like, a plurality of types of surfaces on which wiring is printed and that have different hardnesses and different properties need to be flattened simultaneously.

Chemical mechanical polishing (CMP) is normally performed as a technique for ensuring the flatness of a substrate for a semiconductor device. With CMP, surfaces of a substrate are polished to be flattened, using a polishing pad while supplying a polishing agent (slurry) containing polishing abrasive particles. Although silica slurry is widely used as the polishing agent, cerium oxide particle (ceria) slurry is also used. Silica slurry is mainly used to polish surfaces of a substrate including a portion made of metal such as copper and a portion made of silicon dioxide ($SiO_2$), and ceria slurry is mainly used to polish surfaces of a substrate including an $SiO_2$ portion and a silicon nitride ($Si_3N_4$) portion. After CMP using silica slurry or ceria slurry is performed, cleaning is required in order to remove polishing debris and foreign matter (particles) originating from abrasive particles that remain on the surfaces of the substrate. The following cleaning agent composition and cleaning method are proposed as a cleaning agent composition and a cleaning method used to clean a substrate that has processed CMP, for example.

For example, Patent Document 1 proposes, as a cleaning method by which contaminants originating from cerium oxide or manganese oxide on a substrate may be removed, a method for cleaning a semiconductor substrate, by which chemical mechanical polishing is performed on a semiconductor substrate, and then this semiconductor substrate is cleaned using a mixed solution containing a reducing agent and acid.

Patent Document 2 proposes, as a cleaning liquid that is sufficiently anticorrosive to metal wires and can suppress the formation of residue and attachment of residue to surfaces of a substrate, a substrate cleaning liquid for a semiconductor device that has a pH of 8 or more and contains histidine and a histidine derivative, ascorbic acid, gallic acid, and water.

Patent Document 3 proposes, as a removal composition by which a residual substance can be removed without impairing an interlayer dielectric material and a metal wiring material, a removal composition that contains at least one type of complexing agent, contains substantially no amines or fluoride species, and is useful for removing a residual substance from a microelectronic device having a residual substance thereon.

Patent Document 4 proposes a cleaning agent for an electronic material that contains a surfactant with a pH and redox potential (V) (the unit is mV, vsSHE) satisfying $V \leq -38.7 \times pH + 550$ at 25° C. and the concentration of active components being 0.01 to 15 wt %, as a cleaning agent that has excellent minute particle dispersing properties, the minute particles being problematic in a process for manufacturing an electronic material substrate such as a flat panel display substrate and a photomask substrate, and by which efficient cleaning is possible in a short time without damaging a surface of an electronic material.

PRIOR ART DOCUMENTS

Patent Document
[Patent Document 1] JP H11-251280 A
[Patent Document 2] JP 2015-165562A
[Patent Document 3] JP 2010-535422A
[Patent Document 4] JP 2010-163608A

DISCLOSURE OF INVENTION

Problem to be Solved by the Invention

For the purpose of removing ceria, which is polishing abrasive particles remaining on surfaces of a substrate, hydrofluoric acid cleaning is usually performed after CMP using ceria slurry is performed. On the other hand, in recent years, in the field of semiconductor devices, there is a trend of narrowing the width of a wire for the purpose of reducing the size of a semiconductor device, and thus scratches and surface roughness of a thermal oxide film such as a silicon dioxide film forming an underlayer have significant influences. Also, hydrofluoric acid cleaning is problematic in that a thermal oxide film is highly soluble in hydrofluoric acid and thus scratches are formed and surfaces become rough, which influences processes performed after cleaning, resulting in a decrease in the yield and the quality of semiconductor devices, and thus a cleaning agent that has excellent cleaning properties against ceria remaining on surfaces of a substrate and does not reduce flatness is required, instead of hydrofluoric acid. However, the cleaning agent compositions disclosed in the patent documents above do not have sufficient cleaning properties against ceria.

Also, a cleaning agent is normally stored in a container or a storage tank until the cleaning agent is used in cleaning, and is transferred to a cleaning tank when the cleaning agent is used, is diluted with a solvent as needed, and then used. Also, for the purpose of improving the productivity and reducing the load of treating waste water, a cleaning agent is sometimes repeatedly used. Thus, a cleaning agent that is unlikely to be influenced by aging is required, but there is a problem in that organic components deteriorate in an environment in which acidity is strong and the cleaning agent is exposed to air and the cleaning performance thereof decreases over time. In particular, a decrease in the solubility of ceria over time is a problem.

In view of this, the present disclosure provides a cleaning agent composition for a substrate for a semiconductor device, the cleaning agent composition having excellent cleaning properties against ceria and being capable of reducing a temporal change in the solubility of ceria, a method for cleaning a substrate for a semiconductor device using the cleaning agent composition, and a method for manufacturing a substrate for a semiconductor device using the cleaning agent composition.

Means for Solving Problem

In one aspect, the present disclosure relates to a cleaning agent composition for a substrate for a semiconductor device, the cleaning agent composition containing a component A, a component B, a component C, and a component D, the component A being sulfuric acid;
the component B being ascorbic acid;
the component C being at least one of thiourea and dithiothreitol; and
the component D being water.

In one aspect, the present disclosure relates to a method for cleaning a substrate for a semiconductor device, the method including a cleaning step of cleaning a substrate to be cleaned, using the cleaning agent composition according to the present disclosure, in which the substrate to be cleaned is a substrate that has processed polishing using a polishing liquid composition containing ceria.

In one aspect, the present disclosure relates to a method for manufacturing a substrate for a semiconductor device, the method including a cleaning step of cleaning a substrate to be cleaned, using the cleaning agent composition according to the present disclosure, in which the substrate to be cleaned is a substrate that has processed polishing using a polishing liquid composition containing ceria.

In one aspect, the present disclosure relates to a method for manufacturing a substrate for a semiconductor device, the method including:

step 1 of polishing a substrate using a polishing liquid composition containing ceria;

step 2 of cleaning a substrate that has been polished in the step 1 using the cleaning agent composition according to the present disclosure.

In one aspect, the present disclosure relates to use of the cleaning agent composition according to the present disclosure in cleaning of a substrate for a semiconductor device.

Effects of the Invention

According to the present disclosure, it is possible to provide a cleaning agent composition for a substrate for a semiconductor device, the cleaning agent composition having excellent cleaning properties against ceria and being capable of reducing a temporal change in the solubility of ceria. Also, as a result of using the cleaning agent composition according to the present disclosure, a high-quality substrate for a semiconductor device can be obtained.

DESCRIPTION OF THE INVENTION

The present disclosure is based on findings that, as a result of adding the above-described components A to D to a cleaning agent composition, the solubility of ceria is improved and a temporal change in the solubility of ceria is reduced. Also, the present disclosure is based on findings that, if a cleaning agent composition containing the above-described components A to D is used in cleaning of a substrate that has processed CMP using ceria slurry, ceria remaining on a surface of a substrate can be efficiently cleaned off.

That is, in one aspect, the present disclosure relates to a cleaning agent composition for a substrate for a semiconductor device (also referred to as a "cleaning agent composition according to the present disclosure" hereinafter), the cleaning agent composition containing a component A, a component B, a component C, and a component D, the component A being sulfuric acid;
the component B being ascorbic acid;
the component C being at least one of thiourea and dithiothreitol; and
the component D being water.

According to the present disclosure, it is possible to provide a cleaning agent composition for a substrate for a semiconductor device, the cleaning agent composition having excellent cleaning properties against ceria and being capable of reducing a temporal change in the solubility of ceria. Also, as a result of using the cleaning agent composition according to the present disclosure, a high-quality substrate for a semiconductor device can be obtained.

Although some details of the functional mechanism of the effects of the cleaning agent composition according to the present disclosure are unclear, the following is inferred.

It is thought that the solubility of ceria (also referred to as "ceria solubility" hereinafter) increases due to sulfuric acid (the component A) and ascorbic acid (the component B) coexisting in the cleaning agent composition according to the present disclosure.

Normally, a cleaning agent composition containing the component A and the component B exhibits strong acidity, and the component B undergoes oxidation degradation due to the component A in an environment in which the cleaning agent composition is exposed to air, and the ceria solubility tends to decrease over time. However, the cleaning agent composition according to the present disclosure contains at least one (the component C) selected from thiourea and dithiothreitol, the component C keeps the component B from undergoing oxidation degradation due to the component A, reduces a temporal change in the ceria solubility, and suppresses a decrease in the ceria solubility over time.

However, the present disclosure need not be interpreted as being limited to these mechanisms.

In the present disclosure, a "temporal change in the ceria solubility" means that the solubility of ceria exposed to a cleaning agent composition immediately after the cleaning agent composition is prepared is different from the solubility of ceria exposed to the cleaning agent composition after a period of time (e.g., one week to one month) has passed from when the cleaning agent composition was prepared. From the viewpoint of the cleaning performance of the cleaning agent composition, a smaller temporal change in the ceria solubility is more preferable.

The Component A: Sulfuric Acid

The component A included in the cleaning agent composition according to the present disclosure is sulfuric acid.

From the viewpoint of facilitating dissolution of ceria, the content of the component A of the cleaning agent composition according to the present disclosure at the time of cleaning is preferably 0.005 mass % or more, more preferably 0.01 mass % or more, even more preferably 0.05 mass % or more, and still more preferably 0.25 mass % or more, and from the viewpoint of reducing a temporal change in the ceria solubility, is preferably 0.5 mass % or less, more preferably 0.3 mass % or less, and even more preferably 0.2 mass % or less, and still more preferably 0.1 mass % or less. More specifically, the content of the component A is preferably 0.005 mass % to 0.5 mass % inclusive, more preferably 0.01 mass % to 0.3 mass % inclusive, even more preferably 0.05 mass % to 0.2 mass % inclusive, and still more preferably 0.05 mass % to 0.1 mass % inclusive.

In the present disclosure, in one or more embodiments, the "content of each component of a cleaning agent composition at the time of cleaning" refers to the content of each component of a cleaning agent composition that is used in a cleaning step, that is, the content of each component of a cleaning agent composition at a time when use of the cleaning agent composition in cleaning is started.

Component B: Ascorbic Acid

The component B included in the cleaning agent composition according to the present disclosure is ascorbic acid. The component B can be used alone or in combination. One or more selected from L-ascorbic acid, erythorbic acid, and salts thereof are examples of the component B, and from the viewpoint of enhancing the ceria solubility, one or more selected from L-ascorbic acid and salts thereof are preferable, and L-ascorbic acid is more preferable.

From the viewpoint of facilitating dissolution of ceria and reducing a temporal change in the ceria solubility, the content of the component B of the cleaning agent composition according to the present disclosure at the time of cleaning is preferably 0.0005 mass % or more, more preferably 0.001 mass % or more, even more preferably 0.002 mass % or more, and still more preferably 0.003 mass % or more, and from the viewpoint of reducing the load of treating waste water, is preferably 1 mass % or less, more preferably 0.5 mass % or less, even more preferably 0.2 mass % or less, still more preferably 0.1 mass % or less, and yet more preferably 0.05 mass % or less. More specifically, the content of the component B is preferably 0.0005 mass % to 1 mass % inclusive, more preferably 0.001 mass % to 0.5 mass % inclusive, even more preferably 0.002 mass % to 0.2 mass % inclusive, still more preferably 0.003 mass % to 0.1 mass % inclusive, and yet more preferably 0.003 mass % to 0.05 mass % inclusive.

From the viewpoint of facilitating dissolution of ceria, a mass ratio B/A of the content of the component B to the content of the component A in the cleaning agent composition according to the present disclosure is preferably 0.01 or more, more preferably 0.02 or more, and even more preferably 0.05 or more, and from a similar viewpoint, the mass ratio B/A is preferably 2 or less, more preferably 1 or less, and even more preferably 0.7 or less. More specifically, from the viewpoint of facilitating dissolution of ceria, the mass ratio B/A is preferably 0.01 to 2 inclusive, more preferably 0.01 to 1 inclusive, and even more preferably 0.01 to 0.7 inclusive. The mass ratio B/A is even more preferably 0.02 to 0.7 inclusive, and still more preferably 0.05 to 0.7 inclusive.

Component C

The component C included in the cleaning agent composition according to the present disclosure is at least one selected from thiourea and dithiothreitol, and from the viewpoint of reducing a temporal change in the ceria solubility, thiourea is more preferable. The component C can be used alone or in combination.

From the viewpoint of facilitating dissolution of ceria, the content of the component C of the cleaning agent composition according to the present disclosure at the time of cleaning is preferably 0.0005 mass % or more, more preferably 0.001 mass % or more, even more preferably 0.002 mass % or more, and still more preferably 0.003 mass % or more, and from the viewpoint of reducing a temporal change in the ceria solubility, is preferably 1 mass % or less, more preferably 0.5 mass % or less, even more preferably 0.2 mass % or less, still more preferably 0.1 mass % or less, and yet more preferably 0.05 mass % or less. More specifically, the content of the component C is preferably 0.0005 mass % to 1 mass % inclusive, more preferably 0.001 mass % to 0.5 mass % inclusive, even more preferably 0.002 mass % to 0.2 mass % inclusive, still more preferably 0.003 mass % to 0.1 mass % inclusive, and yet more preferably 0.003 mass % to 0.05 mass % inclusive.

From the viewpoint of facilitating dissolution of ceria, the total content of the component B and the component C of the cleaning agent composition according to the present disclosure at the time of cleaning is preferably 0.001 mass % or more, more preferably 0.002 mass % or more, and even more preferably 0.004 mass % or more, and from the viewpoint of reducing the load of treating waste water, the total content thereof is preferably 1 mass % or less, more preferably 0.5 mass % or less, even more preferably 0.2 mass % or less, still more preferably 0.1 mass % or less, and yet more preferably 0.05 mass % or less. More specifically, the total content of the component B and the component C is preferably 0.001 mass % to 1 mass % inclusive, more preferably 0.002 mass % to 0.5 mass % inclusive, even more preferably 0.004 mass % to 0.2 mass % inclusive, even more preferably 0.004 mass % to 0.1 mass % inclusive, and still more preferably 0.004 mass % to 0.05 mass % inclusive.

From the viewpoint of facilitating dissolution of ceria, a mass ratio B/C of the content of the component B to the content of the component C in the cleaning agent composition according to the present disclosure is preferably 0.05 or more, more preferably 0.1 or more, and even more preferably 0.2 or more, and from the viewpoint of reducing a temporal change in the ceria solubility, is preferably 10 or less, more preferably 7 or less, and even more preferably 5 or less. More specifically, the mass ratio B/C is preferably 0.05 to 10 inclusive, more preferably 0.1 to 7 inclusive, and even more preferably 0.2 to 5 inclusive.

From the viewpoint of facilitating dissolution of ceria, a mass ratio (B+C)/A of the total content of the component B and the component C to the content of the component A in the cleaning agent composition according to the present disclosure is preferably 0.01 or more, more preferably 0.02 or more, and even more preferably 0.03 or more, and from the viewpoint of reducing a temporal change in the ceria solubility, is preferably 3 or less, more preferably 2 or less, and even more preferably 1.5 or less. More specifically, the mass ratio (B+C)/A is preferably 0.01 to 3 inclusive, more preferably 0.02 to 2 inclusive, and even more preferably 0.03 to 1.5 inclusive.

Component D: Water

The component D included in the cleaning agent composition according to the present disclosure is water. Water such as ion-exchanged water, RO water, distilled water, pure water, or ultrapure water may be used as the component D, for example. The content of the component D in the cleaning agent composition according to the present disclosure can be set as appropriate in accordance with a mode of usage of the cleaning agent composition.

From the viewpoint of facilitating dissolution of ceria, the content of the component D of the cleaning agent composition according to the present disclosure at the time of cleaning is preferably 90 mass % or more, more preferably 95 mass % or more, even more preferably 99 mass % or more, and still more preferably 99.5 mass % or more, and from a similar viewpoint, is preferably 99.99 mass % or less, more preferably 99.95 mass % or less, and even more preferably 99.9 mass % or less. More specifically, the content of the component D is preferably 90 mass % to 99.99 mass % inclusive, more preferably 95 mass % to 99.95 mass % inclusive, even more preferably 99 mass % to 99.9 mass % inclusive, and still more preferably 99.5 mass % to 99.9 mass % inclusive.

Component E: Dispersing Agent

The cleaning agent composition according to the present disclosure may further contain a dispersing agent (a component E).

Even if polishing debris and foreign matter originating from polishing abrasive particles that remain on surfaces of a substrate are temporarily lifted off from the substrate, normally, they are likely to re-attach to surfaces of the substrate, and thus the cleaning agent composition also needs to have good foreign matter dispersing properties. In particular, if polishing abrasive particles include ceria and silica, the cleaning agent composition needs to have good ceria and silica dispersing properties. To address this, it is thought that, if the cleaning agent composition according to the present disclosure contains the component E, the dispersiveness of polishing debris that are attached to surfaces of a substrate and ceria and silica originating from polishing abrasive particles increases, and the cleaning properties against ceria are synergistically improved. Thus, the cleaning agent composition according to the present disclosure containing the component E may be suitably used in cleaning of a substrate that has processed CMP using a polishing liquid composition containing ceria and silica. In the present disclosure, the dispersiveness of ceria and silica exposed to the cleaning agent composition is also referred to as "ceria-silica dispersiveness".

In one embodiment, examples of the component E include at least one selected from compounds represented by Formula (I) below, compounds represented by Formula (II) below, compounds represented by Formula (III) below, polymers including a constitutional unit e1 derived from a vinyl-based monomer having a carboxylic acid group, polymers including a constitutional unit e2 derived from a vinyl-based monomer having a sulfonic acid group, and polymers including a constitutional unit e3 derived from an aromatic monomer having a sulfonic acid group. The component E can be used alone or in combination.

[Chemical Formula 1]

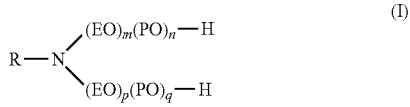
(I)

In Formula (I) above, from the viewpoint of improving ceria-silica dispersiveness, preferably, R represents a hydrocarbon group having 10 or more and 22 or less carbon atoms. From a similar viewpoint, the number of carbon atoms of R is preferably 10 or more, more preferably 12 or more, and even more preferably 16 or more, and preferably 22 or less, and more preferably 20 or less. More specifically, the number of carbon atoms of R is preferably 10 to 22 inclusive, more preferably 12 to 20 inclusive, and even more preferably 16 to 20 inclusive.

In Formula (I) above, EO represents an ethylene oxide group, PO represents a propylene oxide group, m and p each represent the average number of added EO moles, and n and q each represent the average number of added PO moles. From the viewpoint of improving the ceria-silica dispersiveness, m and p are independently preferably 2 or more, more preferably 3 or more, even more preferably 5 or more, even more preferably 7 or more, and preferably 20 or less, more preferably 18 or less, and even more preferably 15 or less. More specifically, m and p are independently preferably 2 to 20 inclusive, more preferably 3 to 18 inclusive, even more preferably 5 to 15 inclusive, and still more preferably 7 to 15 inclusive. From the viewpoint of improving ceria-silica dispersiveness, n and q are independently preferably 0 or more, and preferably 5 or less, more preferably 3 or less, even more preferably 2 or less, and still more preferably 1 or less. More specifically, n and q are independently preferably 0 to 5 inclusive, more preferably 0 to 3 inclusive, even more preferably 0 to 2 inclusive, and still more preferably 0 to 1 inclusive. From the viewpoint of improving the ceria-silica dispersiveness, m+p is preferably 5 or more, more preferably 7 or more, even more preferably 10 or more, and still more preferably 15 or more, and preferably 34 or less, more preferably 30 or less, even more preferably 25 or less, and still more preferably 20 or less. More specifically, m+p is preferably 5 to 34 inclusive, more preferably 7 to 30 inclusive, even more preferably 10 to 25 inclusive, and still more preferably 15 to 20 inclusive. From the viewpoint of improving the ceria-silica dispersiveness, a ratio between a numerical value (m+p) and the number of carbon atoms of R ((m+p)/the number of carbon atoms of R) is preferably 0.3 or more, more preferably 0.35 or more, even more preferably 0.4 or more, still more preferably 0.6 or more, and preferably 1.7 or less, more preferably 1.6 or less, and even more preferably 1.2 or less. EOs and POs may be arranged as blocks or at random. More specifically, the ratio ((m+p)/the number of carbon atoms of R) is preferably 0.3 to 1.7 inclusive, more preferably 0.35 to 1.6 inclusive, and even more preferably 0.4 to 1.2 inclusive. The ratio ((m+p)/the number of carbon atoms of R) is still more preferably 0.6 to 1.2 inclusive.

Examples of the compound represented by Formula (I) include polyoxyethylene laurylamine, polyoxyethylene polyoxypropylene laurylamine, polyoxyethylene stearylamine, and polyoxyethylene polyoxypropylene stearylamine.

(II)

In Formula (II) above, from the viewpoint of improving ceria-silica dispersiveness, preferably, $R^2$ represents a hydrocarbon group having 1 or more and 24 or less carbon atoms. From a similar viewpoint, the number of carbon atoms of $R^2$ is preferably 1 or more, more preferably 6 or more, and even more preferably 8 or more, and preferably 24 or less, more preferably 20 or less, and even more preferably 18 or less. More specifically, the number of carbon atoms of $R^2$ is preferably 1 to 24 inclusive, more preferably 6 to 20 inclusive, and even more preferably 8 to 18 inclusive.

In Formula (II) above, from the viewpoint of improving ceria-silica dispersiveness, AO is preferably an alkylene oxide group having 2 or more and 4 or less carbon atoms, and more preferably an ethylene oxide group and/or a propylene oxide group. The number of types of AO may be one or more. If the number of types of AO is two or more, AOs may be added at random or in the form of blocks.

In Formula (II) above, r represents the average number of added AO moles, and from the viewpoint of improving ceria-silica dispersiveness, r is preferably 0 or more, and preferably 90 or less, more preferably 30 or less, and even more preferably 20 or less. More specifically, r is preferably 0 to 90 inclusive, more preferably 0 to 30 inclusive, and even more preferably 0 to 20 inclusive. From the viewpoint of improving ceria-silica dispersiveness, M is preferably a hydrogen atom or a cation, and from the viewpoint of a rinsing property, M is preferably a hydrogen atom.

Examples of the compound represented by Formula (II) include polyoxyethylene octyl sulfuric acid ester, polyoxyethylene octyl sulfuric acid ester sodium salt, polyoxyethylene lauryl sulfuric acid ester, and polyoxyethylene lauryl sulfuric acid ester sodium salt.

$$R^3O\text{-}(AO)s\text{-}SO_3Q \qquad (III)$$

In Formula (III) above, from the viewpoint of improving ceria-silica dispersiveness, $R^3$ is preferably a hydrogen atom or $-SO_3Q$.

In Formula (III) above, from the viewpoint of improving ceria-silica dispersiveness, AO is preferably an alkylene oxide group having 2 or more and 4 or less carbon atoms, and more preferably an ethylene oxide group and/or a propylene oxide group. The number of types of AO may be one or more. If the number of types of AO is two or more, AOs may be added at random or in the form of blocks.

In Formula (III) above, s represents the average number of added AO moles, and from the viewpoint of improving ceria-silica dispersiveness, s is preferably 10 or more, more preferably 20 or more, and even more preferably 30 or more, and preferably 130 or less, more preferably 100 or less, and even more preferably 85 or less. More specifically, s is preferably 10 to 130 inclusive, more preferably 20 to 100 inclusive, and even more preferably 30 to 85 inclusive. From the viewpoint of improving ceria-silica dispersiveness, Q is preferably a hydrogen atom or a cation, and from the viewpoint of a rinsing property, Q is preferably a hydrogen atom.

Examples of the compound represented by Formula (III) include polyoxyethylene sulfuric acid esters, polyoxyethylene sulfuric acid ester sodium salts, polyoxyethylene disulfuric acid esters, and polyoxyethylene disulfuric acid ester sodium salts.

A vinyl-based monomer (simply also referred to as a "monomer e1" hereinafter) having a carboxylic acid group that is a source for supplying the constitutional unit e1 is at least one selected from acrylic acid, methacrylic acid, maleic acid, fumaric acid, itaconic acid, and salts thereof. Examples of the salts include alkali metals such as lithium, sodium, and potassium; alkaline earth metals such as calcium; ammonium; and alkanolamines such as triethanolamine, and these salts may be used alone or in combination.

Examples of a polymer including the constitutional unit e1 include homopolymers of the monomer e1, and copolymers of the monomer e1 and a monomer other than the monomer e1. Specific examples of the polymer including the constitutional unit e1 include polyacrylic acid, acrylic acid/maleic acid copolymers, and methacrylic acid/monomethoxypolyoxyethylene methacrylic acid ester copolymers.

A vinyl-based monomer (also simply referred to as a "monomer e2" hereinafter) having a sulfonic acid group that is a source for supplying the constitutional unit e2 is at least one selected from 2-hydroxy-3-(allyloxy)-1-propanesulfonic acid (HAPS), 2-acrylamide-2-methylpropane sulfonic acid (AMPS), acrylamide-t-butyl sulfonic acid (ATBS), vinyl sulfonic acid, and salts thereof. A salt of the above-described vinyl-based monomer having a carboxylic acid group can be used as a salt.

Examples of a polymer including the constitutional unit e2 include homopolymers of the monomer e2, and copolymers of the monomer e2 and a monomer other than the monomer e2. Specific examples of a polymer including the constitutional unit e2 include acrylic acid/HAPS copolymers, acrylic acid/AMPS copolymers, and acrylic acid/ATBS copolymers.

An aromatic monomer (also simply referred to as a "monomer e3" hereinafter) having a sulfonic acid group that is a source for supplying the constitutional unit e3 is at least one selected from styrenesulfonic acid, benzenesulfonic acid, toluenesulfonic acid, naphthalenesulfonic acid, methylnaphthalenesulfonic acid, ethylnaphthalenesulfonic acid, propylnaphthalenesulfonic acid, butylnaphthalenesulfonic acid, and salts thereof. A salt of the above-described vinyl-based monomer having a carboxylic acid group can be used as a salt.

One or more selected from homopolymers of the monomer e3, copolymers of the monomer e3 and a monomer other than the monomer e3, products obtained through condensation of the monomer e3 using formalin, and salts thereof are examples of a polymer including the constitutional unit e3. Specific examples of a polymer including the constitutional unit e3 include polystyrene sulfonic acid, styrene/styrene sulfonic acid copolymers, and sodium salts of products obtained through condensation of naphthalene sulfonic acid using formalin.

For example, the component E may be a polymer including two or more selected from the constitutional unit e1, the constitutional unit e2, and the constitutional unit e3, such as acrylic acid/HAPS copolymers, acrylic acid/AMPS copolymers, and acrylic acid/ATBS copolymers.

If the component E is a polymer including the constitutional unit e1, the constitutional unit e2, and/or the constitutional unit e3, the component E may also contain another constitutional unit e4 other than the constitutional unit e1, the constitutional unit e2, and the constitutional unit e3. Examples of the other constitutional unit e4 include constitutional units derived from at least one compound selected from polyoxyethylene methacrylates, polyoxyethylene acrylates, polyoxyethylene allyl ethers, monomethoxy polyoxyethylene methacrylic acid esters, formaldehyde, 1-butene, 2-butene, ethylene, propene, and styrene.

From the viewpoint of improving ceria-silica dispersiveness, the weight average molecular weight of the component E is preferably 1,000 or more, more preferably 2,000 or more, and even more preferably 3,000 or more, and from a similar viewpoint, is preferably 50,000 or less, more preferably 20,000 or less, and even more preferably 10,000 or less. More specifically, the weight average molecular weight of the component E is preferably 1,000 to 50,000 inclusive, more preferably 2,000 to 20,000 inclusive, and even more preferably 3,000 to 10,000 inclusive. The weight average molecular weight of the component E can be measured using a method described in working examples.

From the viewpoint of improving ceria-silica dispersiveness, the content of the component E of the cleaning agent composition according to the present disclosure at the time of cleaning is preferably 0.02 mass % or more, more preferably 0.05 mass % or more, even more preferably 0.08 mass % or more, and still more preferably 0.1 mass % or more, and from the viewpoint of reducing the load of treating waste water, is preferably 1 mass % or less, more preferably 0.7 mass % or less, even more preferably 0.6 mass % or less, still more preferably 0.5 mass % or less, yet more preferably 0.3 mass % or less, and even yet more preferably 0.2 mass % or less. More specifically, the content of the component E is preferably 0.02 mass % to 1 mass % inclusive, more preferably 0.05 mass % to 0.7 mass % inclusive, even more preferably 0.08 mass % to 0.6 mass % inclusive, still more preferably 0.1 mass % to 0.5 mass % inclusive, yet more preferably 0.1 mass % to 0.3 mass % inclusive, and even yet more preferably 0.1 mass % to 0.2 mass % inclusive.

Other Optional Components

The cleaning agent composition according to the present disclosure may contain optional components other than the above-described components A to E as needed. Examples of the other optional components include components that are commonly used in cleaning agents, including compounds having a chelate effect, such as aminocarboxylic acid salts (e.g., hydroxyethyl aminoacetic acid, hydroxyethyl iminodiacetic acid, and ethylenediaminetetraacetic acid), a reducing agent, an antiseptic, a rust-preventive agent, a germicide, an antibacterial agent, a silicone-based antifoam, an antioxidant, and esters such as coconut fatty acid methyl and benzyl acetate, and alcohols.

From the viewpoint of avoiding hindering the effect of the present disclosure, the content of the other optional components of the cleaning agent composition according to the present disclosure at the time of cleaning is preferably 0 mass % to 2.0 mass % inclusive, more preferably 0 mass % to 1.5 mass % inclusive, even more preferably 0 mass % to 1.3 mass % inclusive, and still more preferably 0 mass % to 1.0 mass % inclusive.

pH of Cleaning Agent Composition

From the viewpoint of improving the cleaning properties against ceria, the pH of the cleaning agent composition according to the present disclosure at the time of cleaning is preferably 5 or less, more preferably 4 or less, even more preferably 3 or less, and still more preferably 2.5 or less, and preferably 1 or more. More specifically, the pH of the cleaning agent composition according to the present disclosure at the time of cleaning is preferably 1 to 5 inclusive, more preferably 1 to 4 inclusive, even more preferably 1 to 3 inclusive, and still more preferably 1 to 2.5 inclusive.

The pH of the cleaning agent composition according to the present disclosure can be adjusted using sulfuric acid, which is the component A, and ascorbic acid, which is the component B, and can also be adjusted using an inorganic acid (e.g., nitric acid); an organic acid (e.g., an oxycarboxylic acid, a polyvalent carboxylic acid, an aminopolycarboxylic acid, or an amino acid); and a basic substance (e.g., metal salts thereof, ammonium salts thereof, ammonia, sodium hydroxide, potassium hydroxide, or an amine), for example. In the present disclosure, the "pH at the time of cleaning" refers to the pH of the cleaning agent composition at 25° C. when the cleaning agent composition is used (after dilution), and can be measured using a pH meter. Specifically the pH thereof can be measured using the method described in working examples.

Method for Manufacturing Cleaning Agent Composition

The cleaning agent composition according to the present disclosure can be manufactured by blending the above-described components A to D, and the component E and optional components as needed, using a known method. For example, the cleaning agent composition according to the present disclosure can be obtained by blending at least the above-described components A to D. Thus, in one aspect, the present disclosure relates to a method for manufacturing a cleaning agent composition, the method including a step of blending at least the above-described components A to D. In the present disclosure, "blending" includes mixing the components A to D, and the component E and optional components as needed, simultaneously or in any order. In the method for manufacturing the cleaning agent composition according to the present disclosure, the blending amount of each component can be equal to the above-described content of each component of the cleaning agent composition according to the present disclosure.

The cleaning agent composition according to the present disclosure may be prepared as a concentrate obtained by reducing the amount of water, which is the component D, through separation, deposition, or the like in a range not impairing the storage stability. From the viewpoint of transportation and storage, the concentrate of the cleaning agent composition is preferably a concentrate with a dilution ratio of 1:10 or more, and from the viewpoint of the storage stability, is preferably a concentrate with a dilution ratio of 1:100 or less. The concentrate of the cleaning agent composition may be diluted with water such that, when the concentrate of the cleaning agent composition is used, the amount of each component reaches the above-described content (that is, the content at the time of cleaning), and then used. Also, the concentrate of the cleaning agent composition may be used by separately adding components when the concentrate of the cleaning agent composition is used. In the present disclosure, "when the concentrate of the cleaning agent composition is used" or "at the time of cleaning" refers to a state in which the concentrate of the cleaning agent composition is diluted.

From the viewpoint of improving the cleaning properties after dilution, the pH of the concentrate of the cleaning agent composition according to the present disclosure is preferably 5 or less, more preferably 4 or less, even more preferably 3 or less, and still more preferably 2.5 or less. In the present disclosure, the pH of the concentrate of the cleaning agent composition can be measured using a method that is similar to the above-described method used to measure the pH at the time of cleaning.

Substrate to be Cleaned

In one or more embodiments, the cleaning agent composition according to the present disclosure may be used to clean a substrate that has processed polishing using a polishing liquid composition containing ceria (ceria slurry), clean a substrate that has processed polishing using a polishing liquid composition containing ceria and silica, clean a substrate that has processed CMP using ceria slurry, clean a substrate that has processed CMP using a polishing liquid composition containing ceria and silica, clean a substrate with surfaces to which foreign matter originating from ceria abrasive particles is attached, or clean a substrate with surfaces to which foreign matter originating from ceria and silica abrasive particles is attached. The cleaning agent composition according to the present disclosure can be used for substrates to be cleaned that are made of various materials and have various shapes. An example of the substrate to be cleaned is a substrate that has processed polishing, and specific examples thereof include a substrate that has processed polishing using a polishing liquid composition containing ceria, a substrate that has processed polishing using a polishing liquid composition containing ceria and silica, a substrate that has processed CMP using a polishing liquid composition containing ceria, a substrate that has processed CMP using a polishing liquid composition containing ceria and silica, a substrate with surfaces to which foreign matter originating from ceria abrasive particles is attached, and a substrate with surfaces to which foreign matter originating from ceria and silica abrasive particles is attached. Examples of a substrate include substrates for a semiconductor device such as silicon substrates, glass substrates, and ceramic substrates. Thus, in one aspect, the present disclosure relates to use of the cleaning agent composition according to the present disclosure in cleaning of a substrate for a semiconductor device. A material of a surface of a substrate to be cleaned to which the cleaning agent composition according to the present disclosure can be applied is not particularly limited, and examples thereof include single crystal silicon, polycrystalline silicon, amorphous silicon, a thermal silicon oxide film, a non-doped silicate glass film, a phosphorus-doped silicate glass film, a boron-doped silicate glass film, a phosphorus boron-doped silicate glass film, a tetraethyl orthosilicate (TEOS) film, a plasma CVD oxide film, a silicon nitride film, a silicon carbide film, a silicon oxide carbide film, and a silicon oxide carbide nitride film. Also, examples thereof include glass, quartz, rock crystal, and ceramics. The substrate to be cleaned may be constituted by these materials alone, have a pattern with a certain distribution of two or more materials, or stacked layers of two or more materials.

Method for Cleaning Substrate

In one aspect, the present disclosure relates to a method for cleaning a substrate for a semiconductor device (also referred to as a "cleaning method according to the present disclosure" hereinafter), the method including a cleaning step of cleaning a substrate to be cleaned, using the cleaning agent composition according to the present disclosure. The above-described substrate can be used as a substrate to be cleaned. In one or more embodiments, the cleaning step may include a step of causing the cleaning agent composition according to the present disclosure to come into contact with the substrate to be cleaned. Examples of the method for cleaning a substrate to be cleaned, using the cleaning agent composition according to the present disclosure include a method for placing the substrate to be cleaned in a cleaning tank to cause the substrate to be cleaned to come into contact with the cleaning agent composition, a method for causing the substrate to be cleaned to come into contact with the cleaning agent composition in a bath of an ultrasonic cleaning apparatus, a method for emitting the cleaning agent composition in the form of spray to cause the cleaning agent composition to come into contact with the substrate to be cleaned, a method for discharging or spraying the cleaning agent composition onto the substrate to be cleaned that is being rotated, to cause the cleaning agent composition to come into contact therewith, a method for emitting the cleaning agent composition in the form of spray while applying ultrasonic waves to the cleaning agent composition, to cause the cleaning agent composition to come into contact with the substrate to be cleaned, and a method for causing the cleaning agent composition to come into contact with a substrate to be cleaned, using a brush or the like while spraying the cleaning agent composition.

If the cleaning agent composition according to the present disclosure is a concentrate, the cleaning method according to the present disclosure may further include a dilution step of diluting the concentrate of the cleaning agent composition. The cleaning method according to the present disclosure preferably includes a step of, after a substrate to be cleaned has been brought into contact with the cleaning agent composition, rinsing the resulting substrate with water and drying the substrate. The cleaning method according to the present disclosure makes it possible to efficiently remove ceria remaining on a surface of a substrate. From the viewpoint of the cleaning properties of the cleaning method according to the present disclosure, it is preferable to use, in CMP, a polishing liquid composition containing ceria, or a polishing liquid composition containing ceria and silica. In the cleaning method according to the present disclosure, it is preferable to emit ultrasonic waves when the cleaning agent composition according to the present disclosure and a substrate to be cleaned come into contact with each other, and it is more preferable to use relatively strong ultrasonic waves, because the cleaning power of the cleaning agent composition according to the present disclosure can be easily exhibited. From a similar viewpoint, 20 to 2,000 kHz is preferable, 40 to 2,000 kHz is more preferable, and 40 to 1,500 kHz is even more preferable as an ultrasonic wave emission condition.

Method for Manufacturing Substrate for Semiconductor Device

In one aspect, the present disclosure relates to a method for manufacturing a substrate for a semiconductor device (also referred to as a "substrate manufacturing method according to the present disclosure" hereinafter), the method including a cleaning step of cleaning a substrate to be cleaned, using the cleaning agent composition according to the present disclosure. The above-described substrates can be used as substrates to be cleaned. The cleaning method and the cleaning condition in the cleaning step of the substrate manufacturing method according to the present disclosure are the same as those in the above-described cleaning step of the cleaning method according to the present disclosure.

In one embodiment, the substrate manufacturing method according to the present disclosure may include a step of performing CMP, which is performed in a step of forming an element isolation structure, using a polishing liquid composition containing ceria (ceria slurry), and a step of cleaning, using the cleaning agent composition according to the present disclosure, a substrate to be cleaned.

In another embodiment, the substrate manufacturing method according to the present disclosure may include:

step 1 of polishing a substrate using a polishing liquid composition containing ceria;

step 2 of cleaning a substrate that has been polished in the step 1 using the cleaning agent composition according to the present disclosure.

Herein, a specific example of the step of performing CMP will be described below.

First, a silicon substrate is exposed to oxygen in an oxidation furnace to form a silicon substrate including a silicon dioxide layer. Next, a silicon nitride ($Si_3N_4$) film is formed using a CVD (Chemical Vapor Deposition) method on the silicon dioxide layer side of the silicon substrate, for example, on the silicon dioxide layer. Next, trenches are formed using a photolithography technique in a substrate that is obtained in this manner and includes the silicon substrate and the silicon nitride film disposed on one main side of the silicon substrate, for example, a substrate including the silicon substrate and the silicon nitride film disposed on one main surface of the silicon substrate, or a substrate constituted by the silicon substrate and the silicon nitride film disposed on one main surface of the silicon substrate, the trenches penetrating the silicon nitride film and the bottom of the trenches reaching an inner portion of the silicon substrate. Next, a silicon oxide ($SiO_2$) film for filling trenches is formed using a CVD method using silane gas and oxygen gas, for example, and silicon oxide is embedded in the trenches, and a substrate to be polished in which the trenches and the silicon nitride film are covered by the silicon oxide film is obtained. As a result of forming the silicon oxide film, the trenches are filled with silicon oxide of the silicon oxide film, and a surface of the silicon nitride film that is opposite to the surface thereof on the silicon substrate side is coated by the silicon oxide film. The surface of the silicon oxide film that is formed in this manner and is opposite to the surface thereof on the silicon substrate side has a level difference formed in correspondence with unevenness of an underlayer. Next, the silicon oxide film is polished using ceria slurry using a CMP method until at least the surface of the silicon nitride film that is opposite to the surface thereof on the silicon substrate side is exposed, and it is more preferable to polish the silicon oxide film until the surface of the silicon oxide film and the surface of the silicon nitride film are flush with each other.

With the substrate manufacturing method according to the present disclosure, as a result of using the cleaning agent composition according to the present disclosure in cleaning of a substrate to be cleaned, the amount of foreign matter such as abrasive particles and polishing debris remaining on surfaces of the substrate that has processed CMP is reduced, defects occurring in a post process due to foreign matter remaining are reduced, and thus a highly reliable substrate for a semiconductor device can be manufactured. Also, as a result of using the cleaning method according to the present disclosure, residue such as abrasive particles and polishing debris on surfaces of a substrate that has processed CMP can be easily cleaned off, and thus the cleaning time can be shortened, and the manufacturing efficiency of substrates for a semiconductor device can be improved.

Kit

In one aspect, the present disclosure relates to a kit to be used in the cleaning method according to the present disclosure and/or the substrate manufacturing method according to the present disclosure, the kit including at least one of the above-described components A to D constituting the cleaning agent composition according to the present disclosure in a state in which the at least one component is not mixed with another component.

An example of one embodiment of the kit according to the present disclosure is a kit including a solution containing the component A (a first liquid) and a solution containing the components B to D (a second liquid) in a state in which these liquids are not mixed with each other, and these liquids are mixed when the kit is used (a two-liquid cleaning agent composition). The first liquid and the second liquid may each be mixed with the above-described component E and optional components as needed. After the first liquid and the second liquid have been mixed, the resulting mixture may be diluted with an aqueous medium as needed.

An example of another embodiment of the kit according to the present disclosure is a kit that includes the solution containing the component A (the first liquid), the solution containing the component B (the second liquid), and a solution containing the component C (a third liquid) in a state in which these liquids are not mixed with each other, and at least one of the first liquid and the second liquid further contains the component D, and the first liquid, the second liquid, and the third liquid are mixed when the kit is used (a three-liquid cleaning agent composition), and the first liquid, the second liquid, and the third liquid are each mixed with the above-described component E and optional components as needed. After the first liquid, the second liquid, and the third liquid are mixed, the resulting mixture may be diluted with an aqueous medium as needed.

The present disclosure also relates to the following cleaning agent composition, cleaning method, manufacturing method, and kit.

(1) A cleaning agent composition for a substrate for a semiconductor device, the cleaning agent composition containing a component A, a component B, a component C, and a component D, the component A being sulfuric acid;
the component B being ascorbic acid;
the component C being at least one of thiourea and dithiothreitol; and
the component D being water.

(2) The cleaning agent composition according to (1), in which a content of the component A at the time of cleaning is preferably 0.005 mass % or more, more preferably 0.01 mass % or more, even more preferably 0.05 mass % or more, and still more preferably 0.25 mass % or more.

(3) The cleaning agent composition according to (1) or (2), in which a content of the component A at the time of cleaning is preferably 0.5 mass % or less, more preferably 0.3 mass % or less, even more preferably 0.2 mass % or less, and still more preferably 0.1 mass % or less.

(4) The cleaning agent composition according to any of (1) to (3), in which a content of the component B at the time of cleaning is preferably 0.0005 mass % or more, more preferably 0.001 mass % or more, even more preferably 0.002 mass % or more, and still more preferably 0.003 mass % or more.

(5) The cleaning agent composition according to any of (1) to (4), in which a content of the component B at the time of cleaning is preferably 1 mass % or less, more preferably 0.5 mass % or less, even more preferably 0.2 mass % or less, still more preferably 0.1 mass % or less, and yet more preferably 0.05 mass % or less.

(6) The cleaning agent composition according to any of (1) to (5), in which a mass ratio B/A of a content of the component B to a content of the component A is preferably 0.01 or more, more preferably 0.02 or more, and even more preferably 0.05 or more.

(7) The cleaning agent composition according to any of (1) to (6), in which a mass ratio B/A of a content of the component B to a content of the component A is preferably 2 or less, more preferably 1 or less, and even more preferably 0.7 or less.

(8) The cleaning agent composition according to any of (1) to (7), in which a content of the component C at the time of cleaning is preferably 0.0005 mass % or more, more preferably 0.001 mass % or more, even more preferably 0.002 mass % or more, and still more preferably 0.003 mass % or more.

(9) The cleaning agent composition according to any of (1) to (8), in which a content of the component C at the time of cleaning is preferably 1 mass % or less, more preferably 0.5 mass % or less, even more preferably 0.2 mass % or less, still more preferably 0.1 mass % or less, and yet more preferably 0.05 mass % or less.

(10) The cleaning agent composition according to any of (1) to (9), in which a total content of the component B and the component C at the time of cleaning is preferably 0.001 mass % or more, more preferably 0.002 mass % or more, and even more preferably 0.004 mass % or more.

(11) The cleaning agent composition according to any of (1) to (10), in which a total content of the component B and the component C at the time of cleaning is preferably 1 mass % or less, more preferably 0.5 mass % or less, even more preferably 0.2 mass % or less, still more preferably 0.1 mass % or less, and yet more preferably 0.05 mass % or less.

(12) The cleaning agent composition according to any of (1) to (11), in which a mass ratio B/C of a content of the component B to a content of the component C is preferably 0.05 or more, more preferably 0.1 or more, and even more preferably 0.2 or more.

(13) The cleaning agent composition according to any of (1) to (12), in which a mass ratio B/C of a content of the component B to a content of the component C is preferably 10 or less, more preferably 7 or less, and even more preferably 5 or less.

(14) The cleaning agent composition according to any of (1) to (13), in which a mass ratio (B+C)/A of a total content of the component B and the component C to a content of the component A is preferably 0.01 or more, more preferably 0.02 or more, and even more preferably 0.03 or more.

(15) The cleaning agent composition according to any of (1) to (14), in which a mass ratio (B+C)/A of a total content of the component B and the component C to a content of the component A is preferably 3 or less, more preferably 2 or less, and even more preferably 1.5 or less.

(16) The cleaning agent composition according to any of (1) to (15), in which a content of the component D at the time of cleaning is preferably 90 mass % or more, more preferably 95 mass % or more, even more preferably 99 mass % or more, and still more preferably 99.5 mass % or more.

(17) The cleaning agent composition according to any of (1) to (16), in which a content of the component D at the time of cleaning is preferably 99.99 mass % or less, more preferably 99.95 mass % or less, and even more preferably 99.9 mass % or less.

(18) The cleaning agent composition according to any of (1) to (17), further containing a dispersing agent (a component E).

(19) The cleaning agent composition according to (18), in which the component E is at least one selected from compounds represented by Formula (I) below, compounds represented by Formula (II) below, compounds represented by Formula (III) below, polymers including a constitutional unit e1 derived from a vinyl-based monomer having a carboxylic acid group, polymers including a constitutional unit e2 derived from a vinyl-based monomer having a sulfonic acid group, and polymers including a constitutional unit e3 derived from an aromatic monomer having a sulfonic acid group.

[Chemical Formula 2]

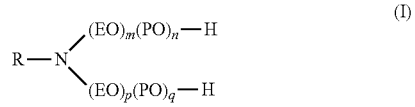

$$R-N\begin{matrix}(EO)_m(PO)_n-H\\(EO)_p(PO)_q-H\end{matrix}$$ (I)

In Formula (I) above, R represents a hydrocarbon group having 10 or more and 22 or less carbon atoms, EO represents an ethylene oxide group, PO represents a propylene oxide group, m and p each represent the average number of added EO moles, n and q each represent the average number of added PO moles, m and p are independently a number of 2 to 20 inclusive, n and q are independently a number of 0 to 5 inclusive, m+p is 5 to 34 inclusive, a ratio between a numerical value (m+p) and the number of carbon atoms of R ((m+p)/the number of carbon atoms of R) is 0.3 to 1.7 inclusive, and EOs and POs may be arranged as blocks or at random.

$$R^2O\text{-}(AO)r\text{-}SO_3M$$ (II)

In Formula (II) above, $R^2$ represents a hydrocarbon group having 1 or more and 24 or less carbon atoms, AO represents an alkylene oxide group having 2 or more and 4 or less carbon atoms, r represents the average number of added AO moles and is a number of 0 to 90 inclusive, and M represents a hydrogen atom or a cation.

$$R^3O\text{-}(AO)s\text{-}SO_3Q$$ (III)

In Formula (III) above, $R^3$ represents a hydrogen atom or —$SO_3Q$, AO represents an alkylene oxide group having 2 or more and 4 or less carbon atoms, s represents the average number of added AO moles and is a number of 10 to 130 inclusive, and Q represents a hydrogen atom or a cation.

(20) The cleaning agent composition according to (18) or (19), in which a weight average molecular weight of the component E is preferably 1,000 or more, more preferably 2,000 or more, and even more preferably 3,000 or more.

(21) The cleaning agent composition according to any of (18) to (20), in which a weight average molecular weight of the component E is preferably 50,000 or less, more preferably 20,000 or less, and even more preferably 10,000 or less.

(22) The cleaning agent composition according to any of (18) to (21), in which a content of the component E at the time of cleaning is preferably 0.02 mass % or more, more preferably 0.05 mass % or more, even more preferably 0.08 mass % or more, and still more preferably 0.1 mass % or more.

(23) The cleaning agent composition according to any of (18) to (22), in which a content of the component E at the time of cleaning is preferably 1 mass % or less, more preferably 0.7 mass % or less, even more preferably 0.6 mass % or less, still more preferably 0.5 mass % or less, yet more preferably 0.3 mass % or less, and even yet more preferably 0.2 mass % or less.

(24) The cleaning agent composition according to any of (1) to (23), in which a pH of the cleaning agent composition at the time of cleaning is preferably 5 or less, more preferably 4 or less, even more preferably 3 or less, and still more preferably 2.5 or less.

(25) The cleaning agent composition according to any of (1) to (24), in which a pH of the cleaning agent composition at the time of cleaning is preferably 1 or more.

(26) The cleaning agent composition according to any of (1) to (25), in which a pH of a concentrate of the cleaning agent composition is preferably 5 or less, more preferably 4 or less, even more preferably 3 or less, and still more preferably 2.5 or less.

(27) A method for manufacturing the cleaning agent composition according to any of (1) to (26), the method including a step of blending at least the components A to D.

(28) Use of the cleaning agent composition according to (1) to (26) in cleaning of a substrate that has processed polishing using a polishing liquid composition containing ceria (ceria slurry), use of the cleaning agent composition in cleaning of a substrate that has processed polishing using a polishing liquid composition containing ceria and silica, use of the cleaning agent composition in cleaning of a substrate that has processed CMP using ceria slurry, use of the cleaning agent composition in cleaning of a substrate that has processed CMP using a polishing liquid composition containing ceria and silica, or use of the cleaning agent composition in cleaning of a substrate with a surface to which foreign matter originating from ceria abrasive particles is attached.

(29) A method for cleaning a substrate for a semiconductor device, the method including a cleaning step of cleaning a substrate to be cleaned, using the cleaning agent composition according to any of (1) to (26), in which the substrate to be cleaned is a substrate that has processed polishing using a polishing liquid composition containing ceria.

(30) A method for manufacturing a substrate for a semiconductor device, the method including a cleaning step of cleaning a substrate to be cleaned, using the cleaning agent composition according to any of (1) to (26), in which the substrate to be cleaned is a substrate that has processed polishing using a polishing liquid composition containing ceria.

(31) A kit that is to be used in the method for cleaning a substrate for a semiconductor device according to (29) and/or in the method for manufacturing a substrate for a semiconductor device according to (30), in which the kit includes at least one of the components A to D constituting the cleaning agent composition according to any of (1) to (26) and another component in a state in which the at least one component and the other component are not mixed.

WORKING EXAMPLES

Although the present disclosure will be specifically described below using working examples, the present disclosure is not limited to these working examples.

1. Preparation of Concentrate of Cleaning Agent Composition (Working Examples 1 to 11 and Comparative Examples 1 to 6)

Each component was weighed to a content shown in Table 1 in a 100-mL beaker and mixed under the following conditions, and thus concentrates of cleaning agent compositions of Working Examples 1 to 11 and Comparative Examples 1 to 6 were prepared. The numerical value of each component in Table 1 is indicated in mass % with the components being active components, unless otherwise stated.

Mixing Conditions
 Liquid temperature: 25° C.
 Stirrer: magnetic stirrer (50 mm rotor)
 Rotational speed: 300 rpm
 Stirring time: 10 minutes The following components were used as components included in a cleaning agent composition.

Component A: acid
 A1: sulfuric acid (High Special Grade, manufactured by Wako Pure Chemical Industries, Ltd.)
 A2: phosphoric acid (Guaranteed Reagent, 85 mass %, manufactured by Wako Pure Chemical Industries, Ltd.) (non-component A)

Component B: Ascorbic Acid
 B1: ascorbic acid (L(+)-ascorbic acid (special grade), manufactured by KANTO CHEMICAL CO., INC.)
 B2: hydrogen peroxide (Super Special Grade, 33 mass %, manufactured by Wako Pure Chemical Industries, Ltd.) (non-component B)

Component C:
 C1: thiourea (JIS Guaranteed Reagent, manufactured by NACALAI TESQUE, INC.)
 C2: dithiothreitol (DL-dithiothreitol, manufactured by Tokyo Chemical Industry Co., Ltd.)
 C3: cysteine (L-cysteine (special grade), manufactured by Wako Pure Chemical Industries, Ltd.) (non-component C)

Component D: Water
 D: ultrapure water manufactured using a continuous pure water manufacturing apparatus (Pureconti PC-2000VRL) and a sub-system (Makuace KC-05H) manufacture by KURITA CO., LTD.

Component E: Dispersing Agent
 E1: polyoxyethylene (20 moles) stearylamine (BLAUNON S-220, manufactured by AOKI OIL INDUSTRIAL Co., Ltd.)
 E2: sodium salt of a methacrylic acid/monomethoxy polyoxyethylene (23 moles) methacrylic acid ester (molar ratio 73/23) copolymer (a 40 mass % aqueous solution, the weight average molecular weight: 50,000)
 E3: sodium salt of a product obtained through condensation of 6-naphthalene sulfonic acid using formalin (a 40 mass % aqueous solution, the weight average molecular weight: 5,000)

2. Measurement of Weight Average Molecular Weight

The weight average molecular weight of each used polymer was measured using a gel permeation chromatography (also referred to as "GPC" hereinafter) method under the following conditions. The results of measurement are shown in Table 1.

GPC Conditions
 Column: G4000PWXL+G2500PWXL (manufactured by Tosoh Corporation)
 Eluent 0.2 M phosphate buffer/$CH_3CN$=9/1 (volume ratio)
 Flow rate: 1.0 mL/min
 Column temperature: 40° C.
 Detection: RI
 Sample concentration: 0.5 mg/mL
 Standard substance: in terms of polyethylene glycol

3. Evaluation of Cleaning Agent Composition

Evaluations below were made using the concentrates of the cleaning agent compositions of Working Examples 1 to 11 and Comparative Examples 1 to 6 that were prepared.

Evaluation of Ceria Solubility 0.5 g of the concentrate of each cleaning agent composition and 19.5 g of water were added to a 50-mL jar made of polyethylene to prepare 40-fold diluted cleaning agent compositions (Working Examples 1 to 11 and Comparative Examples 1 to 6). The content of each of the components A to C and E in the prepared cleaning agent composition (also referred to as a "cleaning agent composition at the time of cleaning" hereinafter) and the pH thereof are shown in Table 2. The numerical value of each component in Table 2 is indicated in mass % with the components being active components, unless otherwise stated. The remainder, excluding the components A to C and E is water, which is the component D. The pH shown in Table 2 is the pH of the cleaning agent composition at 25° C., and was measured using a pH meter (HM-30G, manufactured by DKK-TOA CORPORATION), and the obtained pH was a numerical value obtained after an electrode was immersed in a cleaning agent composition for 40 minutes.

Then, 1.5 g of ceria (having an average particle size of 200 nm) was added to the cleaning agent composition at the time of cleaning and the resulting mixture was stirred using a magnetic stirrer at a rotational speed of 200 rpm for 15 minutes. Then, the resulting mixture was filtered using a filter (a membrane filter (a cellulose mixed ester) VMWP02500, the pore size was 0.05 μm, manufactured by Merck KGaA). A filtrate was used for measurement using the ceria concentration measurement method below, and the amount of dissolved ceria (ppm) was calculated from the obtained cerium (Ce) ion concentration.

After the concentrate of each cleaning agent composition was stored at 25° C. for 14 days from when they were prepared, the cleaning agent composition at the time of cleaning (40-fold diluted cleaning agent composition) was prepared according to a procedure that was similar to the above-described procedure, and the amount of dissolved ceria (ppm) was measured.

Then, the amount of dissolved ceria when the cleaning agent composition at the time of cleaning that was obtained from a concentrate obtained immediately after preparation was used was regarded as a "ceria dissolved amount 1" and the amount of dissolved ceria when the cleaning agent composition at the time of cleaning that was obtained from a concentrate obtained after the concentrate was stored for 14 days was used was regarded as a "ceria dissolved amount 2", and a solubility maintenance percentage (%) was calculated using the equation below. The results of the ceria dissolved amount 1, the ceria dissolved amount 2, and the solubility maintenance percentage are shown in Table 2. The larger the ceria dissolved amount is, the better the cleaning properties of a cleaning agent composition against ceria are. The higher the solubility maintenance percentage is, the more a temporal change in the ceria solubility is reduced.

Solubility maintenance percentage (%)=Ceria dissolved amount 2 (ppm)/Ceria dissolved amount 1 (ppm)×100

Method for Measuring Concentration of Ceria 9.5 g of ultrapure water was added to 0.5 g of a filtrate to prepare a 20-fold diluted solution, and the concentration of cerium ions in a measurement sample was measured using an ICP emission spectrophotometer (Optima 5300, manufactured by PerkinElmer, Inc.).

Evaluation of Ceria-Silica Dispersiveness

A ceria-silica sedimentation stability test was performed using the following slurry according to the following procedure, and the ceria-silica dispersiveness was evaluated.

Slurry

Ceria slurry: the concentration of ceria particles was 10%, ceria had an average particle size of 200 nm, water medium Silica slurry: the concentration of silica particles was 20%, silica had an average particle size of 200 nm, water medium Sedimentation Stability Test 0.25 g of the concentrate of each cleaning agent composition, 9.75 g of water, 0.1 g of the ceria slurry 0.05 g of the silica slurry, and 0.05 g of water were added in a 30 mL test tube with a cap, and the test tube was shaken up and down 30 times. 0.5 g of a supernatant obtained immediately after shaking and 0.5 g of a supernatant obtained after the test tube was left for 1 hour were collected, 9.5 g of a diluted liquid adjusted with the concentrate of each cleaning agent composition/ultrapure water being 2.5/97.5 in mass ratio were added to each of the collected supernatants, and the absorbance thereof was measured at a wavelength of 660 nm using a UV spectrophotometer (UV-2700, manufactured by SHIMADZU CORPORATION). The sedimentation stability was calculated using the equation below. The results of calculation are shown in Table 1. The ceria-silica dispersiveness can be evaluated from the sedimentation stability. Table 1 shows that the larger the numerical value of the calculation result is, the better the ceria dispersiveness and the silica dispersiveness are, the better the effect of the cleaning agent composition to suppress reattachment to a substrate is, and the better the cleaning properties are.

Sedimentation stability=(absorbance of supernatant after 1 hour/absorbance of supernatant immediately after shaking)×100

TABLE 1

| Components | Abbr. | Component Names | Working Examples ||||||||| |
|---|---|---|---|---|---|---|---|---|---|---|---|
| | | | 1 | 2 | 3 | 4 | 5 | 6 | 7 | 8 | 9 |
| Concentrates of cleaning agent composition | | | | | | | | | | | |
| Comp. A | A1 | Sulfuric acid | 2.80 | 0.40 | 12.00 | 1.60 | 2.40 | 3.20 | 2.80 | 1.60 | 3.60 |
| | A2 | Phosphoric acid (non-component A) | | | | | | | | | |
| Comp. B | B1 | L-ascorbic acid | 0.20 | 0.20 | 0.20 | 0.04 | 1.60 | 0.20 | 0.20 | 0.20 | 0.20 |
| | B2 | Hydrogen peroxide (non-component B) | | | | | | | | | |
| Comp. C | C1 | Thiourea | 0.20 | 0.20 | 0.20 | 0.20 | 0.20 | | 0.20 | 0.04 | 1.60 |
| | C2 | Dithiothreitol | | | | | | 0.40 | 0.20 | | |
| | C3 | Cysteine (non-component C) | | | | | | | | | |
| Comp. D | D | Ultrapure water | 96.80 | 99.20 | 87.60 | 98.16 | 95.80 | 96.20 | 96.60 | 98.16 | 94.60 |
| Comp. E | E1 | Polyoxyethylene (20 moles) stearylamine | | | | | | | | | |
| | E2 | Methacrylic acid/monomethoxy polyoxyethylene (23 moles) methacrylic acid ester | | | | | | | | | |

TABLE 1-continued

|  | E3 | Sodium salt of product obtained through condensation of β6-naphthalene sulfonic acid using formalin |  |  |  |  |  |  |  |  |
|---|---|---|---|---|---|---|---|---|---|---|

| Table 1 | | | Working Examples | | Comparative Examples | | | | | |
|---|---|---|---|---|---|---|---|---|---|---|
| Components | Abbr. | Component Names | 10 | 11 | 1 | 2 | 3 | 4 | 5 | 6 |
| Concentrates of cleaning agent composition | | | | | | | | | | |
| Comp. A | A1 | Sulfuric acid | 2.80 | 1.60 |  | 2.80 | 3.60 | 2.80 | 2.80 | 2.80 |
|  | A2 | Phosphoric acid (non-component A) |  |  | 2.80 |  |  |  |  |  |
| Comp. B | B1 | L-ascorbic acid | 0.20 | 0.20 | 0.20 |  | 0.20 | 0.24 |  | 0.20 |
|  | B2 | Hydrogen peroxide (non-component B) |  |  |  |  |  |  | 0.20 |  |
| Comp. C | C1 | Thiourea | 0.20 | 0.20 | 0.20 | 0.20 |  |  | 0.20 |  |
|  | C2 | Dithiothreitol |  |  |  |  |  |  |  |  |
|  | C3 | Cysteine (non-component C) |  |  |  |  |  |  |  | 0.20 |
| Comp. D | D | Ultrapure water | 91.60 | 79.80 | 96.80 | 97.00 | 96.20 | 96.96 | 96.80 | 96.80 |
| Comp. E | E1 | Polyoxyethylene (20 moles) stearylamine | 5.20 |  |  |  |  |  |  |  |
|  | E2 | Methacrylic acid/monomethoxy polyoxyethylene (23 moles) methacrylic acid ester |  | 5.20 |  |  |  |  |  |  |
|  | E3 | Sodium salt of product obtained through condensation of β6-naphthalene sulfonic acid using formalin |  | 2.08 |  |  |  |  |  |  |

TABLE 2

| Table 2 | | | Working Examples | | | | | | | | | | | | Comparative Examples | | | | | |
|---|---|---|---|---|---|---|---|---|---|---|---|---|---|---|---|---|---|---|---|---|---|
| Component | | | 1 | 2 | 3 | 1 | 5 | 6 | 7 | 8 | 9 | 10 | 11 | 1 | 2 | 3 | 4 | 5 | 6 |
| Components | Abbr. | Names | | | | | | | | | | | | | | | | | |
| Cleaning agent composition (at time of cleaning) (40-fold dilution) | | | | | | | | | | | | | | | | | | | |
| Comp. A | A1 | Sulfuric acid | 0.070 | 0.010 | 0.300 | 0.040 | 0.060 | 0.080 | 0.070 | 0.040 | 0.090 | 0.070 | 0.040 | | 0.070 | 0.090 | 0.070 | 0.070 | 0.070 |
| | A2 | Phosphoric acid (non-component A) | | | | | | | | | | | | 0.070 | | | | | |
| Comp. B | B1 | L-ascorbic acid | 0.005 | 0.005 | 0.005 | 0.001 | 0.040 | 0.005 | 0.005 | 0.005 | 0.005 | 0.005 | 0.005 | 0.005 | | 0.005 | 0.006 | | |
| | B2 | Hydrogen peroxide (non-component B) | | | | | | | | | | | | | | | | 0.005 | |
| Comp. C | C1 | Thiourea | 0.005 | 0.005 | 0.005 | 0.005 | 0.005 | | 0.005 | 0.001 | 0.040 | 0.005 | 0.005 | 0.005 | 0.005 | | | | |
| | C2 | Dithiothreitol | | | | | | 0.010 | 0.005 | | | | | | | | | | |
| | C3 | Cysteine (non-component C) | | | | | | | | | | | | | | | | | 0.005 |
| Comp. E | E1 | Polyoxyethylene (20 moles) stearylamine | | | | | | | | | | 0.130 | | | | | | | |
| | E2 | Methacrylic acid/ monomethoxy polyoxyethylene (23 moles) methacrylic acid ester | | | | | | | | | | | 0.130 | | | | | | |

TABLE 2-continued

| Table 2 | | | | | | | | | | | | | | | | | | |
|---|---|---|---|---|---|---|---|---|---|---|---|---|---|---|---|---|---|---|
| Component | | Working Examples | | | | | | | | | | | Comparative Examples | | | | | |
| Components | Abbr. Names | 1 | 2 | 3 | 1 | 5 | 6 | 7 | 8 | 9 | 10 | 11 | 1 | 2 | 3 | 4 | 5 | 6 |
| | E3 Sodium salt of product obtained through condensation of β-naphthalene sulfonic acid using formalin | | | | | | | | | | | 0.052 | | | | | | |
| | B + C (mass %) | 0.010 | 0.010 | 0.010 | 0.006 | 0.045 | 0.015 | 0.015 | 0.006 | 0.045 | 0.010 | 0.010 | 0.010 | 0.005 | 0.005 | 0.006 | 0.010 | 0.010 |
| | B/A (mass ratio) | 0.071 | 0.500 | 0.017 | 0.025 | 0.667 | 0.063 | 0.071 | 0.125 | 0.056 | 0.071 | 0.125 | 0.071 | — | 0.056 | 0.086 | 0.071 | 0.071 |
| | B/C (mass ratio) | 1.00 | 1.00 | 1.00 | 0.20 | 8.00 | 0.50 | 0.50 | 5.00 | 0.13 | 1.00 | 1.00 | 1.00 | — | — | — | 1.00 | 1.00 |
| | (B + C/A (mass ratio) | 0.143 | 1.000 | 0.033 | 0.150 | 0.750 | 0.188 | 0.214 | 0.150 | 0.500 | 0.143 | 0.250 | 0.143 | 0.071 | 0.056 | 0.086 | 0.143 | 0.143 |
| | pH | 1.94 | 2.86 | 1.19 | 2.11 | 1.98 | 1.89 | 1.93 | 2.17 | 1.74 | 1.99 | 2.24 | 2.38 | 1.96 | 1.88 | 1.93 | 1.97 | 1.95 |
| Evaluations | | | | | | | | | | | | | | | | | | |
| Cleaning Properties | Ceria dissolved amount 1 (ppm) | 37.5 | 19.9 | 55.9 | 15.2 | 56.5 | 37.5 | 45.2 | 32.9 | 68.1 | 29.0 | 30.6 | 8.9 | 1.3 | 40.1 | 40.4 | 2.4 | 35.5 |
| | Ceria dissolved amount 2 (ppm) | 31.2 | 21.2 | 45.1 | 10.3 | 52.8 | 31.0 | 35.6 | 33.1 | 37.3 | 26.6 | 26.5 | 5.5 | 0.5 | 8.9 | 15.7 | 0.7 | 10.8 |
| Temporal change | Solubility maintenance percentage (%) | 83.2 | 106.4 | 80.7 | 67.8 | 93.5 | 82.7 | 78.8 | 100.6 | 54.8 | 91.6 | 86.6 | 62.3 | 40.0 | 22.2 | 38.8 | 28.0 | 30.3 |
| Ceria-silica dispersiveness | Sedimentation stability (%) | 2.6 | 1.2 | 2.4 | 3.3 | 1.6 | 3.3 | 2.5 | 2.6 | 2.0 | 94.6 | 91.1 | 3.2 | 2.7 | 2.9 | 2.1 | 1.7 | 2.9 |

As shown in Table 2, Working Examples 1 to 11 containing the components A to D had high ceria solubility and better ceria cleaning properties, and a temporal change in the ceria solubility thereof was suppressed. Also, Working Examples 10 and 11 further containing the component E in addition to the components A to D had better ceria-silica dispersiveness. On the other hand, Comparative Example 1 that did not contain the component A did not have good ceria cleaning properties. Comparative Examples 2 and 5 that did not contain the component B did not have good ceria cleaning properties, and the ceria solubility decreased over time. With Comparative Examples 3, 4, and 6 that did not contain the component C, the ceria solubility decreased over time.

INDUSTRIAL APPLICABILITY

A cleaning agent composition according to the present disclosure is useful as a cleaning agent composition used in a process for manufacturing a substrate for a semiconductor device, and a process for cleaning a substrate to which ceria is attached can be shortened and the performance and reliability of a substrate for a semiconductor device to be manufactured can be improved, and the productivity of a semiconductor apparatus can be improved.

The invention claimed is:

1. A cleaning agent composition for a substrate for a semiconductor device, the cleaning agent composition containing a component A, a component B, a component C, and a component D,
   the component A being sulfuric acid;
   the component B being ascorbic acid;
   the component C being at least one of thiourea and dithiothreitol; and
   the component D being water.

2. The cleaning agent composition according to claim 1, wherein a mass ratio B/C of a content of the component B to a content of the component C is 0.05 to 10 inclusive.

3. The cleaning agent composition according to claim 1 or 2, wherein a total content of the component B and the component C at the time of cleaning is 0.001 mass % to 1 mass % inclusive.

4. The cleaning agent composition according to claim 1, wherein a content of the component A at the time of cleaning is 0.005 mass % to 0.5 mass % inclusive.

5. The cleaning agent composition according to claim 1, further containing
   a dispersing agent (a component E).

6. A method for cleaning a substrate for a semiconductor device, the method comprising
   a cleaning step of cleaning a substrate to be cleaned, using the cleaning agent composition according to claim 1,
   wherein the substrate to be cleaned is a substrate that has processed polishing using a polishing liquid composition containing ceria.

7. A method for manufacturing a substrate for a semiconductor device, the method comprising
   a cleaning step of cleaning a substrate to be cleaned, using the cleaning agent composition according to claim 1,
   wherein the substrate to be cleaned is a substrate that has processed polishing using a polishing liquid composition containing ceria.

8. A method for manufacturing a substrate for a semiconductor device, the method comprising:
   step 1 of polishing a substrate using a polishing liquid composition containing ceria; and
   step 2 of cleaning a substrate that has been polished in the step 1, using the cleaning agent composition according to claim 1.

* * * * *